(12) United States Patent
Wei (10) Patent No.: US 11,324,115 B1
(45) Date of Patent: May 3, 2022

(54) CIRCUIT BOARD WITH AT LEAST ONE EMBEDDED ELECTRONIC COMPONENT AND METHOD FOR MANUFACTURING THE SAME

(71) Applicants: QING DING PRECISION ELECTRONICS (HUAIAN) CO.,LTD, Huai an (CN); Avary Holding (Shenzhen) Co., Limited., Shenzhen (CN); GARUDA TECHNOLOGY CO., LTD, New Taipei (TW)

(72) Inventor: Yong-Chao Wei, Qinhuangdao (CN)

(73) Assignees: QING DiNG PRECISION ELECTRONICS (HUAIAN) CO., LTD, Huai an (CN); Avary Holding (Shenzhen) Co., Limited., Shenzhen (CN); GARUDA TECHNOLOGY CO., LTD, New Taipei (TW)

( * ) Notice: Subject to any disclaimer, the term of this patent is extended or adjusted under 35 U.S.C. 154(b) by 0 days.

(21) Appl. No.: 17/106,363

(22) Filed: Nov. 30, 2020

(30) Foreign Application Priority Data

Nov. 20, 2020 (CN) .......................... 202011311188.3

(51) Int. Cl.
*H05K 1/18* (2006.01)
*H05K 1/02* (2006.01)

(52) U.S. Cl.
CPC ........... *H05K 1/0298* (2013.01); *H05K 1/182* (2013.01); *H05K 1/183* (2013.01); *H05K 1/184* (2013.01); *H05K 1/185* (2013.01); *H05K 2201/0195* (2013.01)

(58) Field of Classification Search
CPC ........ H05K 1/183; H05K 1/184; H05K 1/185; H05K 2201/09827; H05K 2201/09845; H05K 1/182–188
See application file for complete search history.

(56) References Cited

U.S. PATENT DOCUMENTS

| | | | |
|---|---|---|---|
| 9,078,373 B1 * | 7/2015 | Lamorey | H05K 1/181 |
| 2006/0154496 A1 * | 7/2006 | Imamura | H05K 1/186 |
| | | | 439/66 |
| 2008/0079118 A1 * | 4/2008 | Bang | H05K 1/183 |
| | | | 257/532 |
| 2009/0211794 A1 * | 8/2009 | Nakaie | H05K 1/184 |
| | | | 174/260 |

(Continued)

*Primary Examiner* — Steven T Sawyer
(74) *Attorney, Agent, or Firm* — ScienBiziP, P.C.

(57) ABSTRACT

A circuit board includes a wiring board. The wiring board includes a first wiring layer, a dielectric layer and a second wiring layer stacked, and a plurality of spaced conductive pillars. Each conductive pillar connects the first wiring layer and the second wiring layer. A groove is recessed from a side of the dielectric layer facing away from the second wiring layer, and includes first recessed portion and at least two spaced second recessed portions recessed from a sidewall of the first recessed portion. An end surface of each conductive pillar is exposed from the at least two spaced second recessed portions, and a sidewall of each pillar close to the first recessed portion is exposed from the second recessed portion. At least one electronic component is received in the first recessed portion, and is connected to the conductive pillars through electrical connecting portions received in the second recessed portions.

8 Claims, 10 Drawing Sheets

(56) References Cited

U.S. PATENT DOCUMENTS

| | | | |
|---|---|---|---|
| 2013/0048361 A1* | 2/2013 | Yamashita | H01L 23/49822 174/260 |
| 2013/0194764 A1* | 8/2013 | Mikado | H05K 1/185 361/761 |
| 2016/0189979 A1* | 6/2016 | Nakatomi | H05K 1/185 438/125 |
| 2016/0219712 A1* | 7/2016 | Ko | H01L 24/13 |

* cited by examiner

CIRCUIT BOARD WITH AT LEAST ONE EMBEDDED ELECTRONIC COMPONENT AND METHOD FOR MANUFACTURING THE SAME

FIELD

The subject matter herein generally relates to a circuit board, especially relates to a circuit board with at least one embedded electronic component and a method for manufacturing the circuit board with the embedded electronic component.

BACKGROUND

Existing embedded circuit boards usually use SMT (Surface Mount Technology) solder paste to solder electronic components on the surface of a substrate. Since the solder paste occupies a certain thickness, it is not conducive to the thinning of the circuit board. However, other existing processes for fixing the electronic component inside the circuit board from the side surface are often more complicated.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
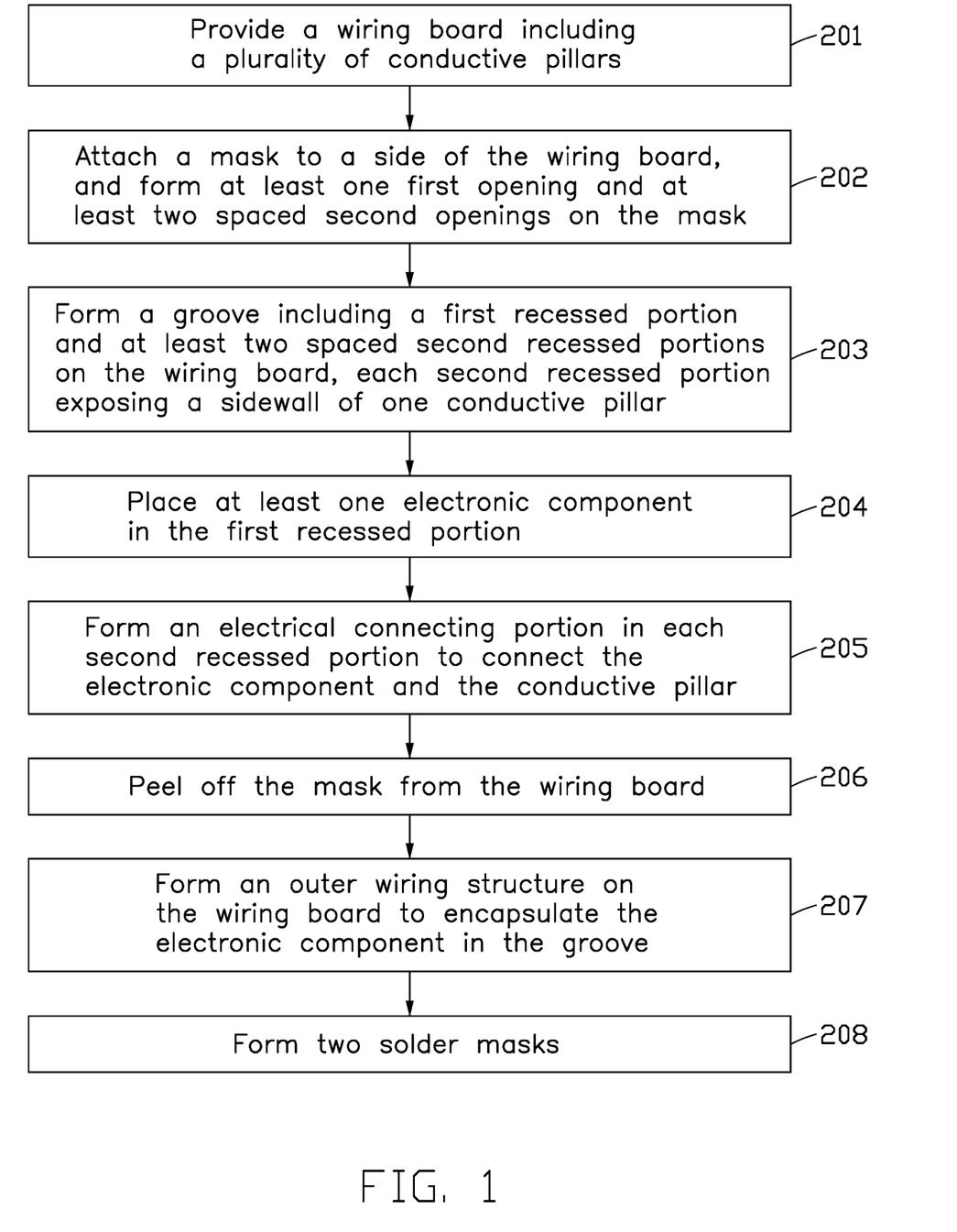
FIG. 1 is a flowchart of an embodiment of a method for manufacturing a circuit board.

FIG. 1 illustrates a flowchart of a method in accordance with an embodiment. The embodiment method for manufacturing a circuit board with at least one embedded electronic component is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 201.

Figure 2:
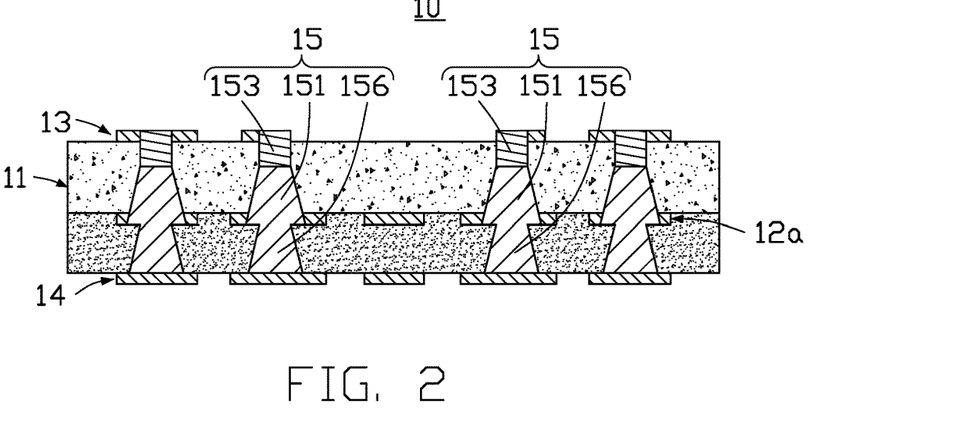
FIG. 2 is a cross-sectional view of an embodiment of a wiring board.

At block 201, referring to FIG. 2, a wiring board 10 is provided. The wiring board 10 includes a dielectric layer 11, a first wiring layer 13, a second wiring layer 14, and a plurality of spaced conductive pillars 15. The first wiring layer 13 and the second wiring layer 14 are formed on opposite sides of the dielectric layer 11. Each of the plurality of spaced conductive pillars 15 penetrates the dielectric layer 11 and electrically connects the first wiring layer 13 and the second wiring layer 14.

The wiring board 10 may be a double-layer wiring board or a multilayer wiring board.

In at least one embodiment, the wiring board 10 is multilayer wiring board. Specifically, the wiring board 10 further includes a third wiring layer 12a embedded in the dielectric layer 11 and located between the first wiring layer 13 and the second wiring layer 14. Each of the plurality of spaced conductive pillars 15 may include a second conductive portion 153, a first conductive portion 151, and a third conductive portion 156 connected in that sequence. The second conductive portion 153 and the first conductive portion 151 are connected between the first wiring layer 13 and the third wiring layer 12a. The third conductive portion 156 is connected between the second wiring layer 14 and an end of the first conductive portion 151 facing away from the first wiring layer 13.

Figure 3A:
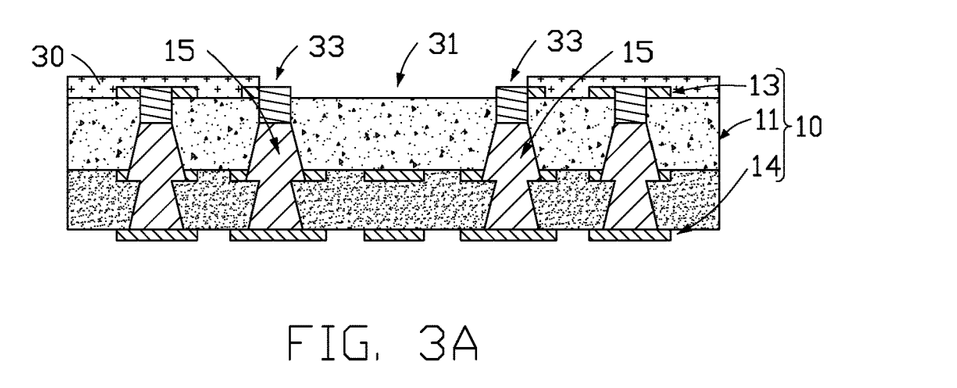
FIG. 3A is a cross-sectional view showing a mask with at least one first opening and at least two spaced second openings on the wiring board of FIG. 2.
Figure 3B:
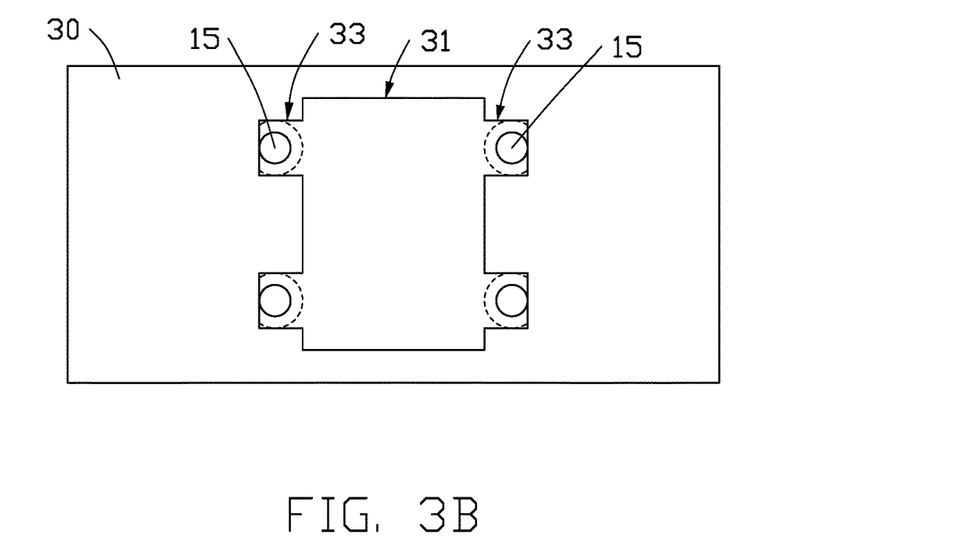
FIG. 3B is a top view of the mask on the wiring board of FIG. 3A.

At block 202, referring to FIGS. 3A and 3B, a mask 30 is attached to a side of the wiring board 10, and at least one first opening 31 exposing a part of the dielectric layer 11 and at least two spaced second openings 33 are formed on the mask 30. Each second opening 33 is recessed from a sidewall of the first opening 31 toward a direction away from a center axis of the first opening 31, and arranged corresponding to one of the plurality of spaced conductive pillars 15 to expose at least a part of an end surface of the corresponding conductive pillar 15.

In at least one embodiment, the mask 30 is attached to a side of the wiring board 10 facing away from the second wiring layer 14.

In at least one embodiment, a shape of each first opening 31 and a shape of each second opening 33 are both rectangular. A distance that the second opening 33 is recessed from the sidewall of the first opening 31 is defined as a width of the second opening 33, and a size of the second opening 33 in a direction perpendicular to the width is defined as a length of the second opening 33. In another embodiment, the shape of each first opening 31 and the shape of each second opening 33 may be both varied as needed, for example, may be regular shapes such as ellipse, circle, sector, polygon, or may be irregular shapes.

Figure 4A:
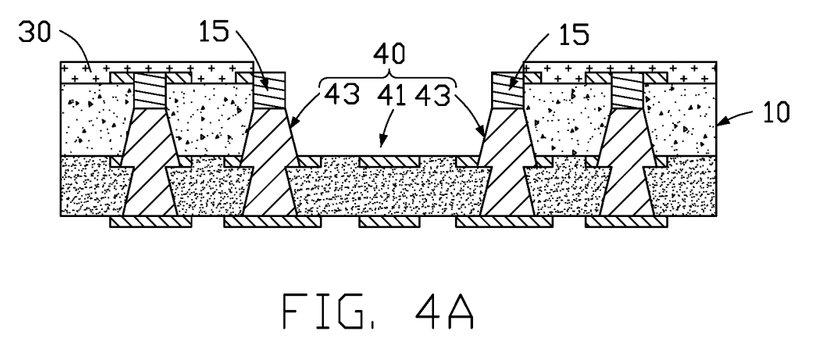
FIG. 4A is a cross-sectional view showing a groove on the wiring board of FIG. 3A
Figure 4B:
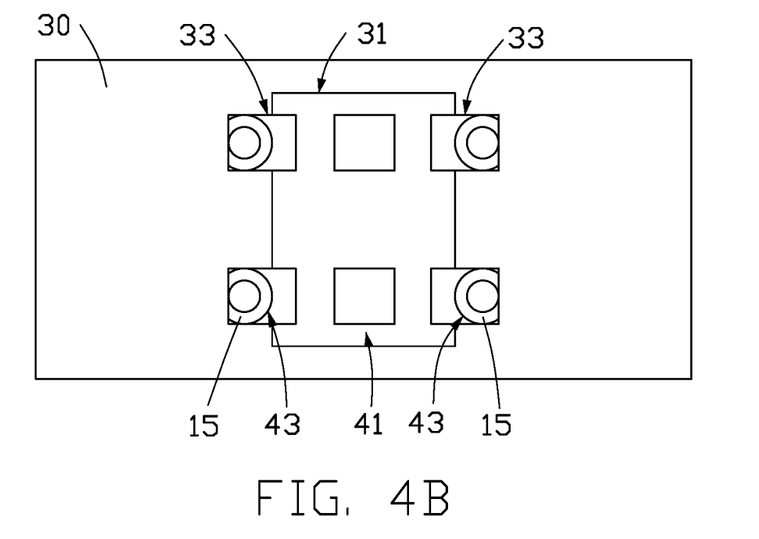
FIG. 4B is a top view of the wiring board with the groove of FIG. 4A.

At block 203, referring to FIGS. 4A and 4B, a part of the dielectric layer 11 exposed from each of the at least one first opening 31 and the second openings 33 communicating with the first opening 31 is removed to form a groove 40, and the groove 40 does not penetrate the dielectric layer 11. Each groove 40 includes a first recessed portion 41 and at least two spaced second recessed portions 43. The first recessed portion 41 corresponds to the first opening 31. Each second recessed portion 43 is recessed from a sidewall of the first recessed portion 41 toward a direction away from a center axis of the first recessed portion 41. Each second recessed portion 43 corresponds to one of the second openings 33 to expose a part of a side wall of the corresponding conductive pillar 15 close to the first recessed portion 41.

In at least one embodiment, a shape of each first recessed portion 41 and a shape of each second recessed portion 43 are both rectangular. In another embodiment, the shape of each first recessed portion 41 and the shape of each second recessed portion 43 may be both varied as needed, for example, may be regular shapes such as ellipse, circle, sector, polygon, or may be irregular shapes.

Figure 5:
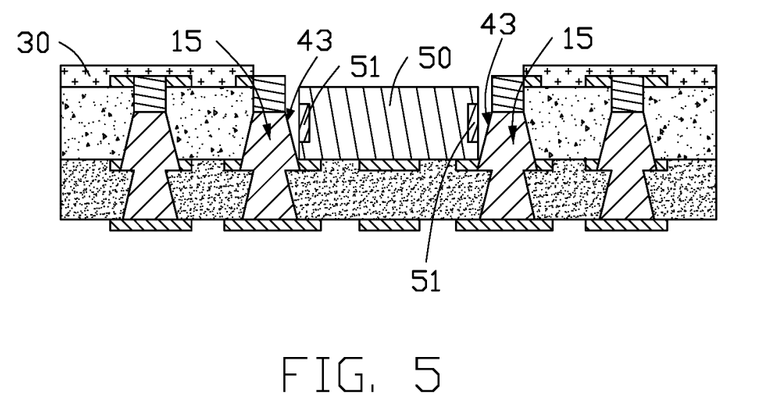
FIG. 5 is a cross-sectional view showing an electronic component in the groove of FIG. 4A.

At block 204, referring to FIG. 5, at least one electronic component 50 is placed in the at least one first recessed portion 41. Each of the at least one electronic component 50 includes at least two spaced connecting pads 51. Each of the at least two spaced connecting pads 51 corresponds to one of the plurality of spaced conductive pillars 15 in the groove 40 exposing the connecting pads 51.

Figure 6A:
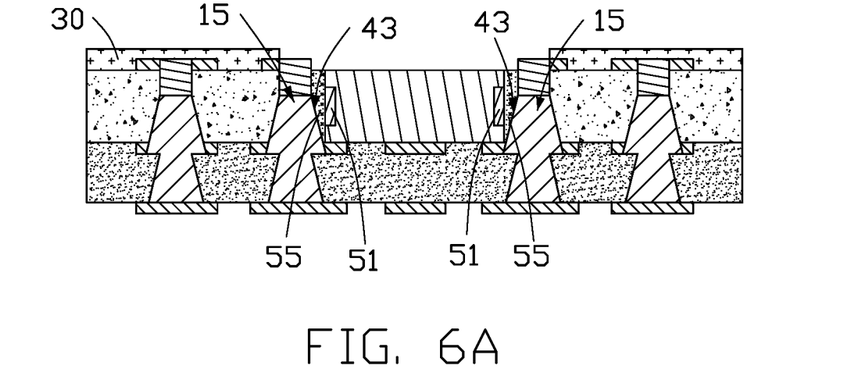
FIG. 6A is a cross-sectional view showing electrical connecting portions electrically connect the electronic component and the wiring board of FIG. 5.
Figure 6B:
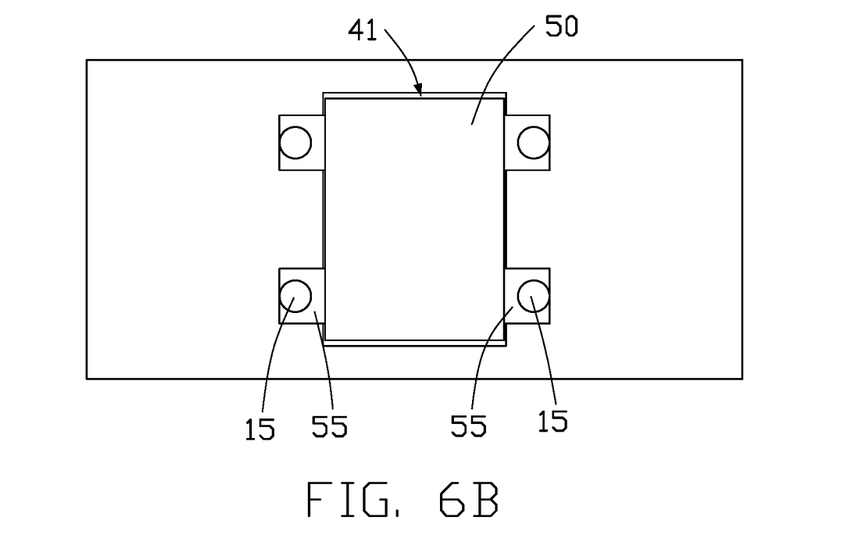
FIG. 6B is atop view of the wiring board with the electrical connecting portions of FIG. 6A.

At block 205, referring to FIGS. 6A and 6B, each of the at least two spaced second recessed portions 43 of each groove 40 is filled with a conductive material to form an electrical connecting portion 55 to electrically connect one of the plurality of spaced conductive pillars 15 corresponding to the recessed portion 43 and the corresponding connecting pad 51.

The conductive material may be soldering flux such as tin paste, which is melted and solidified to form the electrical connecting portion 55 to connect the corresponding conductive pillar 15 and the corresponding connecting pad 51. The conductive material may be conductive glue. The conductive glue fills in the second recessed portion 43 and is cured to form the electrical connecting portion 55.

Figure 7:
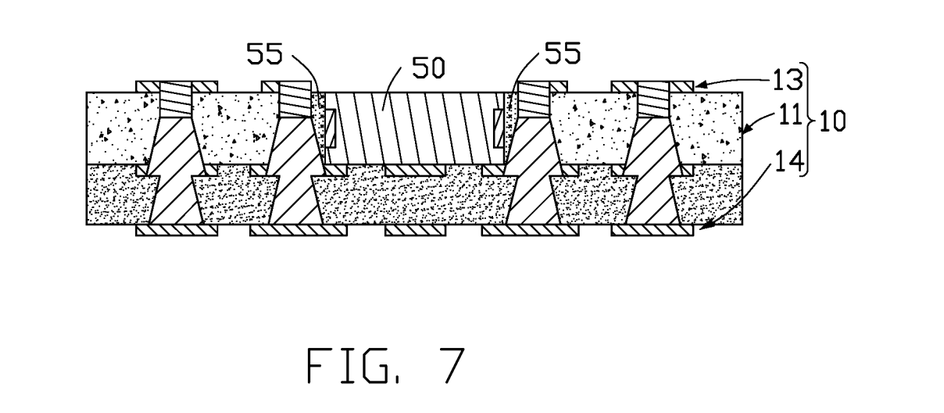
FIG. 7 is a cross-sectional view showing the mask peeled off from the wiring board of FIG. 6A.

At block 206, referring to FIG. 7, the mask 30 is peeled off from the wiring board 10 with the electrical connecting portions 55 and the at least one electronic component 50.

In at least one embodiment, the method for manufacturing a circuit board with at least one embedded electronic component may further includes the following blocks 207 and 208.

Figure 8:
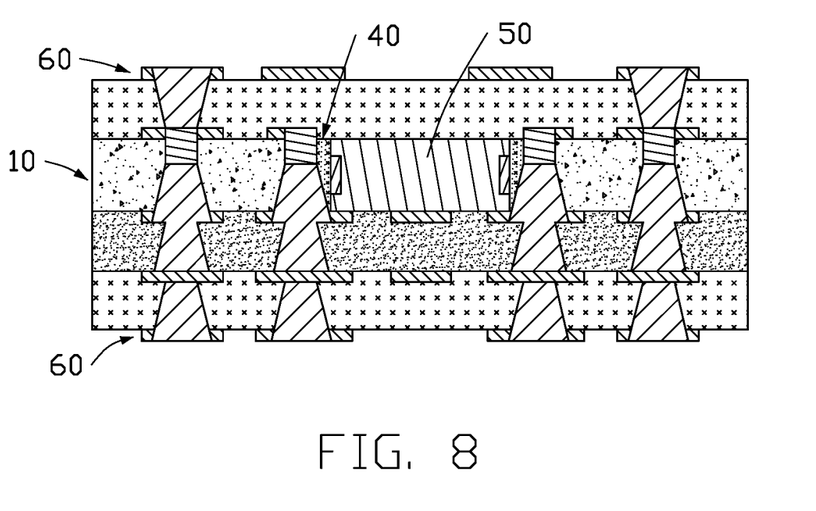
FIG. 8 is a cross-sectional view showing outer wiring structures on the wiring board of FIG. 7.

At block 207, referring to FIG. 8, an outer wiring structure 60 is formed on the side of the wiring board 10 where the groove 40 is provided to encapsulate the at least one electronic component 50 in the at least one groove 40.

In at least one embodiment, two outer wiring structures 60 are formed on two opposite sides of the wiring board 10. Each of the outer wiring structures 60 is single-layer wiring board. In another embodiment, each of the outer wiring structures 60 may be double-layer wiring board or multi-layer wiring board.

When forming the outer wiring structure 60, gaps between the at least one groove 40 and the at least one electronic component 50 is filled with dielectric materials of the dielectric layer 11 and the outer wiring structure 60 during a pressing process.

Figure 9:
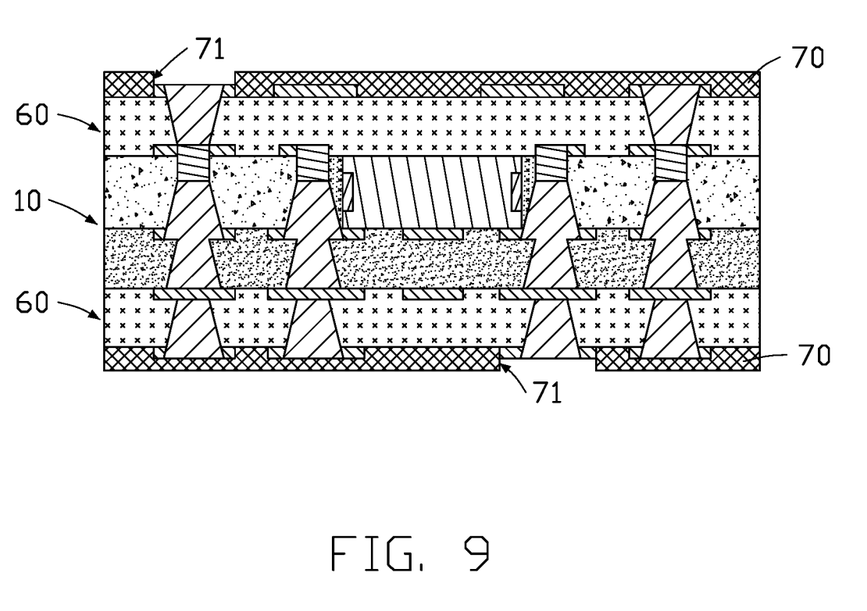
FIG. 9 is a cross-sectional view showing solder masks on the wiring board of FIG. 8.

At block 208, referring to FIG. 9, two solder masks 70 are respectively formed on the opposite sides of the wiring board 10, a side of the outer wiring structure 60 facing away from the wiring board 10 is covered by one of the solder masks 70.

In at least one embodiment, each of the outer wiring structures 60 on the opposite sides of the wiring board 10 is covered by one of the solder masks 70.

Figure 10:
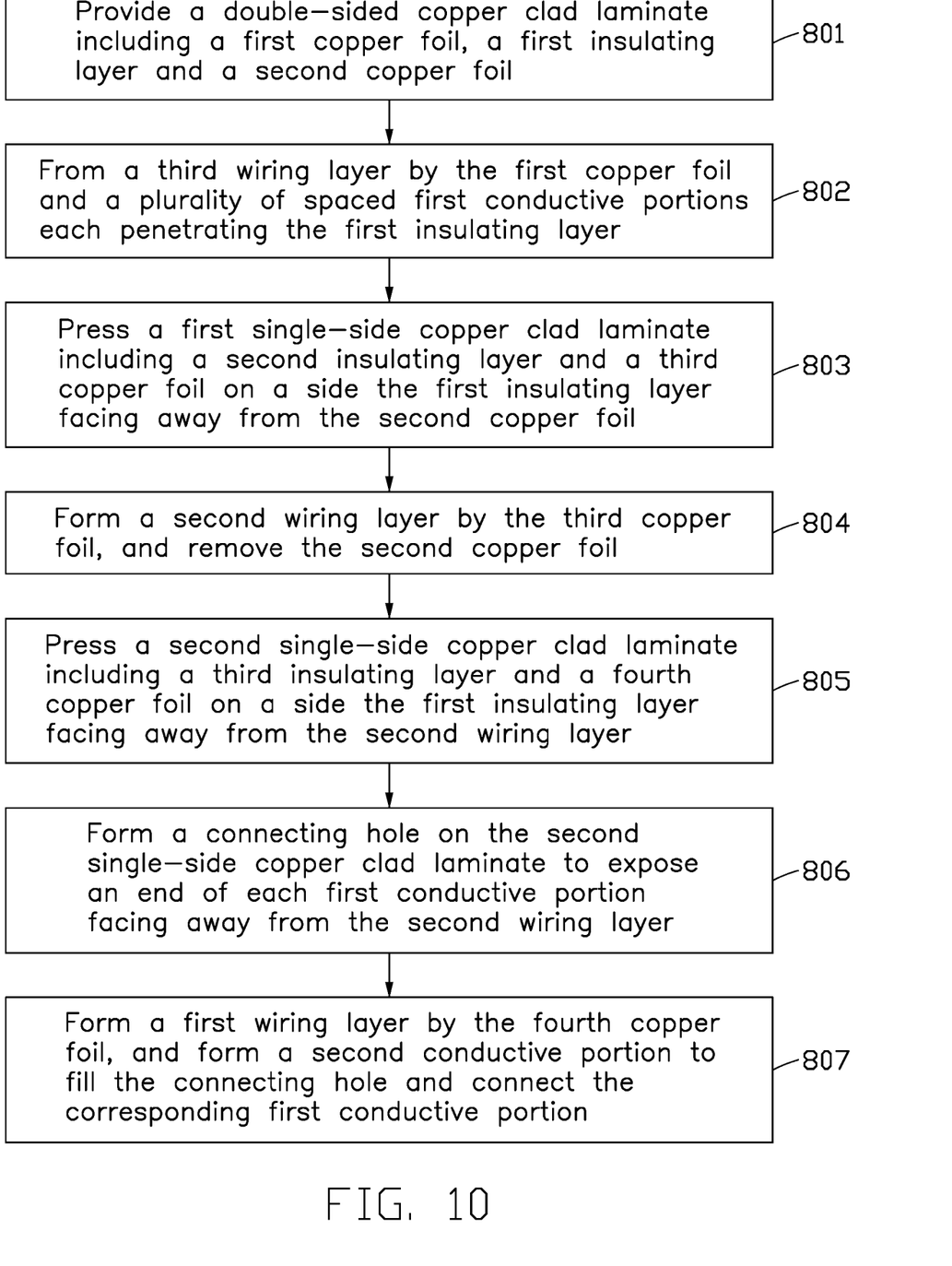
FIG. 10 is a flowchart of an embodiment of a method for manufacturing a wiring board.

FIG. 10 illustrates a flowchart of an embodiment of a method for manufacturing the wiring board 10 (shown in FIG. 1). The method can begin at block 801.

Figure 11:
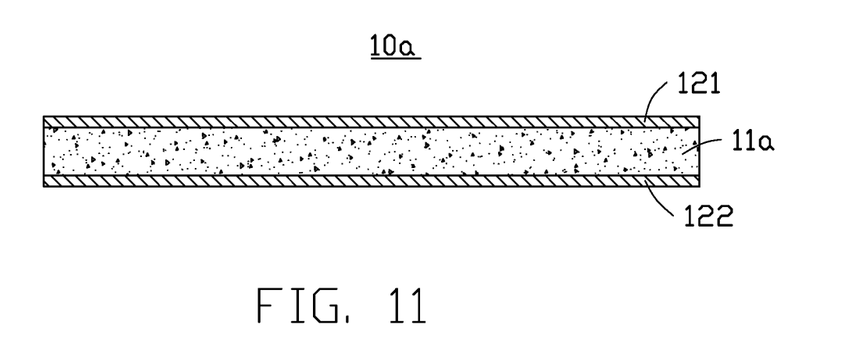
FIG. 11 is a cross-sectional view of an embodiment of a double-sided copper clad laminate including a first copper foil, a first insulating layer and a second copper foil.

At block 801, referring to FIG. 11, a double-sided copper clad laminate 10a is provided. The double-sided copper clad laminate 10a includes a first copper foil 121, a first insulating layer 11a and a second copper foil 122 stacked in that sequence along a first direction.

In at least one embodiment, the first insulating layer 11a is made of a developing material, such as a developable photoresist or a developing ink. In another embodiment, the first insulating layer 11a may be made of other dielectric materials commonly used in the art, such as phenolic resin, epoxy resin (EP), polyimide resin (PI), polyester resin (PET), polyphenylene oxide resin (PPO), polytetrafluoroethylene resin (PTFE), or bismaleimide triazine resin (BT).

Figure 12:
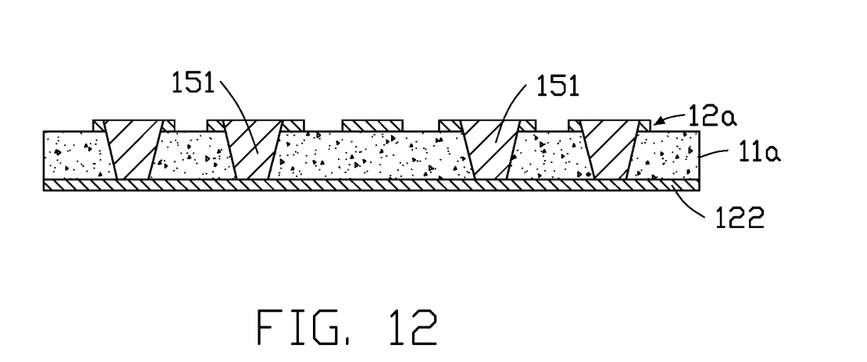
FIG. 12 is a cross-sectional view showing a third wiring layer a plurality of spaced first conductive portions on the first insulating layer of FIG. 11.

At block 802, referring to FIG. 12, a third wiring layer 12a is formed by performing a circuit fabrication process on the first copper foil 121, and a plurality of spaced first conductive portions 151 is formed. Each of the plurality of spaced first conductive portions 151 penetrates the first insulating layer 11a and connects the second wiring layer 12a and the second copper foil 122.

In at least one embodiment, a width of a cross section along the first direction of each of the plurality of spaced first conductive portions 151 may gradually decrease from the third wiring layer 12a to the second copper foil 122.

Therefore, it is convenient to subsequently fill conductive materials to form the electrical connecting portions 55. In at least one embodiment, the cross-section along the first direction of each of the plurality of spaced first conductive portions 151 may be trapezoidal. In at least one embodiment, each of the plurality of spaced first conductive portions 151 may be a circular truncated cone.

Figure 13:
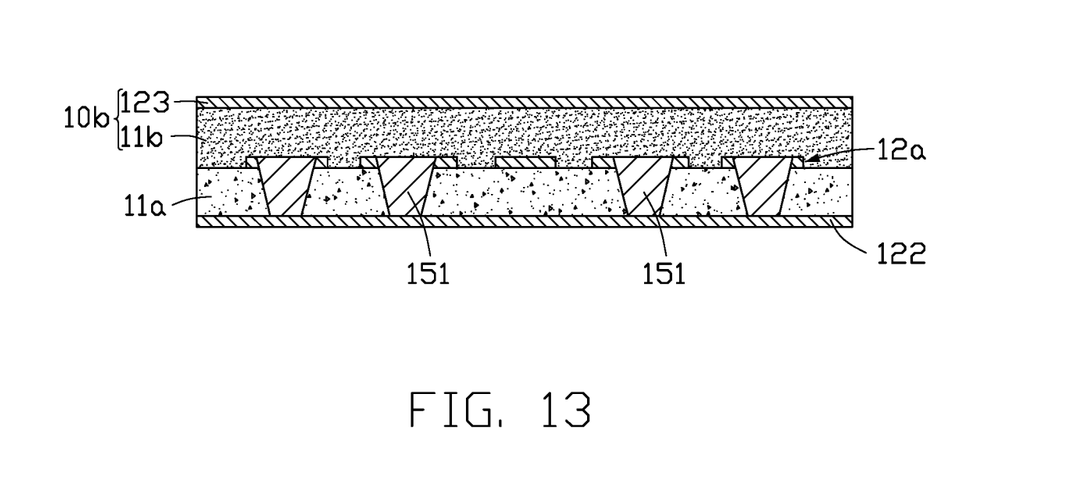
FIG. 13 is a cross-sectional view showing a first single-side copper clad laminate including a second insulating layer and a third copper foil on the first insulating layer of FIG. 12.

At block 803, referring to FIG. 13, a first single-side copper clad laminate 10b is pressed on a side of the first insulating layer 11a facing away from the second copper foil 122. The first single-side copper clad laminate 10b includes a second insulating layer 11b combined with the third wiring layer 12a and a third copper foil 123 formed on the second insulating layer 11b facing away from the third wiring layer 12a.

In at least one embodiment, the second insulating layer 11b may be made of phenolic resin, epoxy resin, polyimide resin, polyester resin, polyphenylene oxide resin, polytetrafluoroethylene resin, or bismaleimide triazine resin.

Figure 14:
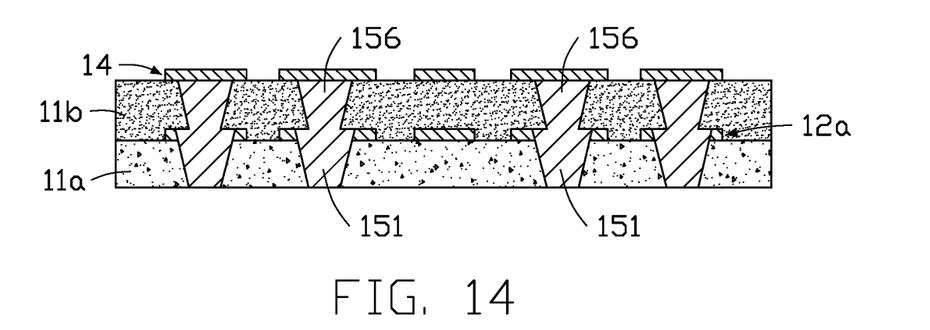
FIG. 14 is a cross-sectional view showing a second wiring layer on the second insulating layer of FIG. 13.

At block 804, referring to FIG. 14, a second wiring layer 14 is formed by performing a circuit fabrication process on the third copper foil 123, and the second copper foil 122 is removed.

In at least one embodiment, a third conductive portion 156 is formed to connect an end of one of the plurality of spaced first conductive portions 151 facing the second wiring layer 14 and the second wiring layer 14.

Figure 15:
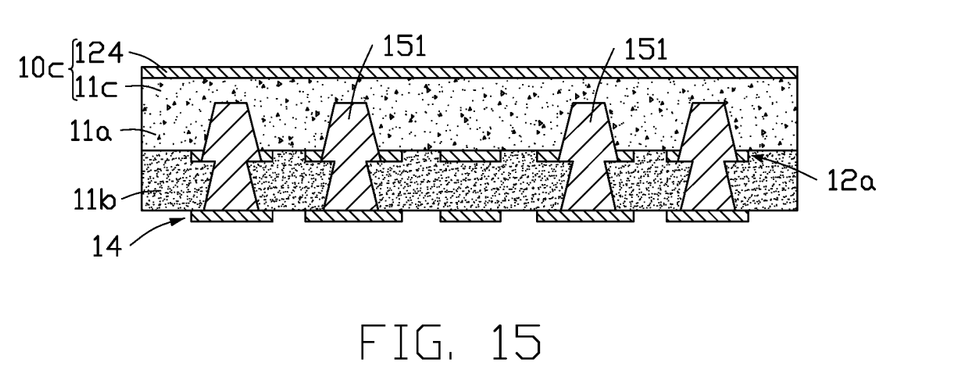
FIG. 15 is a cross-sectional view showing a second single-side copper clad laminate including a third insulating layer and a fourth copper foil on the first insulating layer of FIG. 14.

At block 805, referring to FIG. 15, a second single-side copper clad laminate 10c is pressed on a side of the first insulating layer 11a facing away from the second wiring layer 14. The second single-side copper clad laminate 10c includes a third insulating layer 11c combined with the first insulating layer 11a and a fourth copper foil 124 formed on a side of the third insulating 11c facing away from the first insulating layer 11a.

In at least one embodiment, the third insulating layer 11c may be made of is made of a developing material, such as a developable photoresist or a developing ink. In another embodiment, the third insulating layer 11c may be made of other dielectric materials commonly used in the art, such as phenolic resin, epoxy resin (EP), polyimide resin (PI), polyester resin (PET), polyphenylene oxide resin (PPO), polytetrafluoroethylene resin (PTFE), or bismaleimide triazine resin (BT).

Preferably, the third insulating layer 11c and the first insulating layer 11a are both made of the same materials.

Figure 16:
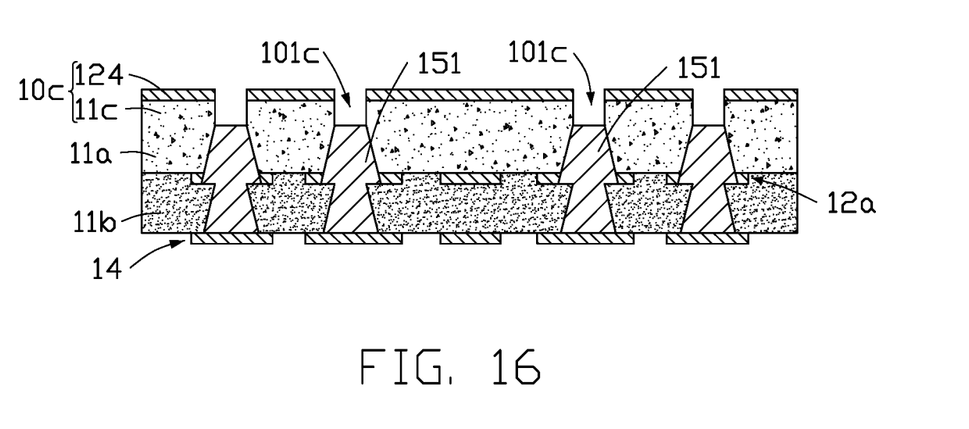
FIG. 16 is a cross-sectional view showing connecting holes on the second single-side copper clad laminate of FIG. 15.

At block 806, referring to FIG. 16, a connecting hole 101c corresponding to each of the plurality of spaced first conductive portions 151 is formed on the second single-side copper clad laminate 10c to expose an end of each of the plurality of spaced first conductive portions 151 facing away from the second wiring layer 14.

In at least one embodiment, in a cross section along the first direction, a maximum width R1 of each connecting hole 101c is less than or equal to a width R2 of the end of the corresponding conductive portion 151 facing away from the second wiring layer 14. In at least one embodiment, R1 is equal to R2, and each connecting hole 101c is cylindrical. In another embodiment, the shape of each connecting hole 101c may be varied as needed.

The connecting hole 101c may be formed by laser cutting or mechanical drilling.

At block 807, referring to FIG. 2, a first wiring layer 13 is formed by performing a circuit fabrication process on the fourth copper foil 124, and a second conductive portion 153 corresponding to each connecting hole 101c is formed to fill the connecting hole 101c and connect the corresponding first conductive portion 151, thereby obtaining the wiring board 10. Each first conductive portion 151 connects the corresponding second conductive portion 153 and the corresponding third conductive portion 156 to form a conductive pillar 15. The first insulating layer 11a, the second insulating layer 11b, and the third insulating layer 11c are formed a dielectric layer 11.

A maximum width R1 of the second conductive portion 153 is less than or equal to the width R2 of the end of the corresponding conductive portion 151 facing away from the second wiring layer 14.

When the first insulating layer 11a and the third insulating layer 11c are both made of developing materials, the part of the dielectric layer 11 exposed from each of the at least one first opening 31 and the second openings 33 is removed by exposure and development to form the groove 40. In at least one embodiment, at least a part of each first conductive portion 151 corresponding to the second openings 33 is exposed from the corresponding second recessed portion 43.

An area of the third insulating layer 11c exposed from the at least one first opening 31 and the at least two spaced second openings 33 and an area of the first insulating layer 11a corresponding to the at least one first opening 31 and the at least two spaced second openings 33, are removed by exposure and development. A thickness of the first insulating layer 11a and a thickness of the third insulating layer 11c may be adjusted as needed, so as to facilitate a subsequent adjustment of a depth of the groove 40 to accommodate the embedding of electronic components of different thicknesses.

A width of an end of the conductive portion 151 facing the second wiring layer 14 is defined as R3. Preferably, the length of the second opening 33 is greater than or equal to R3. The width of the second opening 33 is less than or equal to R3+(R3-R2)/2, and also greater than or equal to (R3−R2)/2. In at least one embodiment, the length of the second opening 33 is R3, and width of the second opening 33 is R3+(R3−R2)/2.

Figure 17:
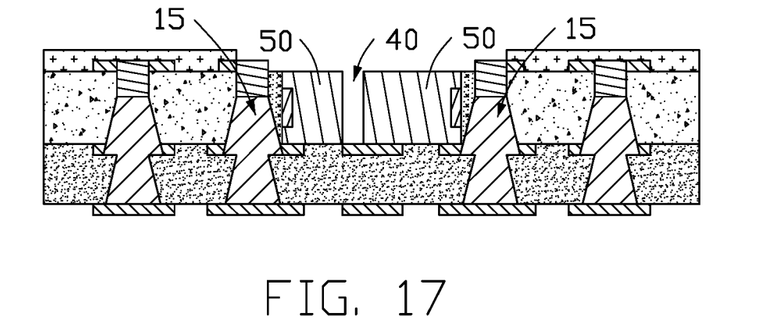
FIG. 17 is a cross-sectional view showing two electronic components in the groove of FIG. 4A.
Figure 18:
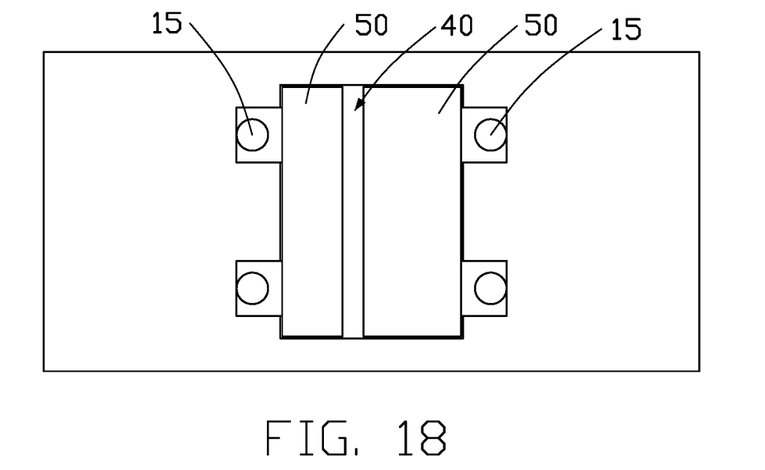
FIG. 18 a top view of the wiring board with the two electronic components of FIG. 17.
Figure 19:
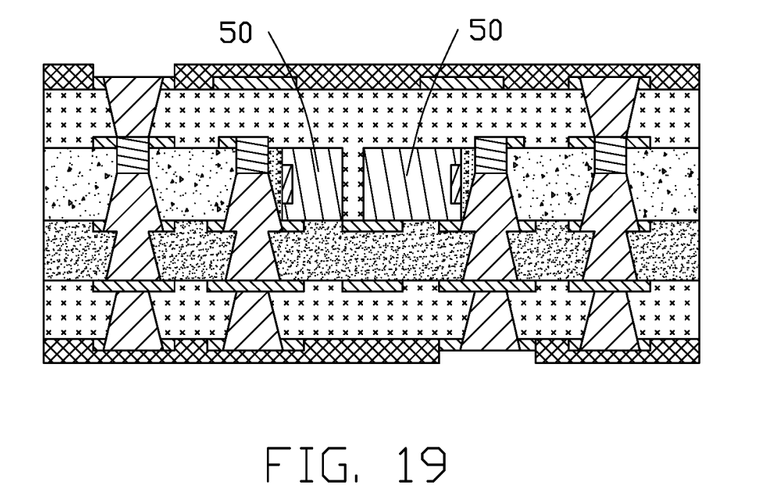
FIG. 19 is a cross-sectional view of an embodiment of a circuit board.

In at least one embodiment, referring to FIGS. 6A and 6B, each of the at least one groove 40 receives one electronic component 50. In another embodiment, referring to FIGS. 17 to 19, each of the at least one groove 40 receives at least two electronic components 50. Referring to FIGS. 6B and 18, when each of the at least one groove 40 corresponds to a plurality of conductive pillars 15 and receives at least two electronic components 50, an arrangement of the at least two electronic components 50 may be adjusted based on an arrangement of the plurality of conductive pillars 15 and the actual need.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Figure 20:
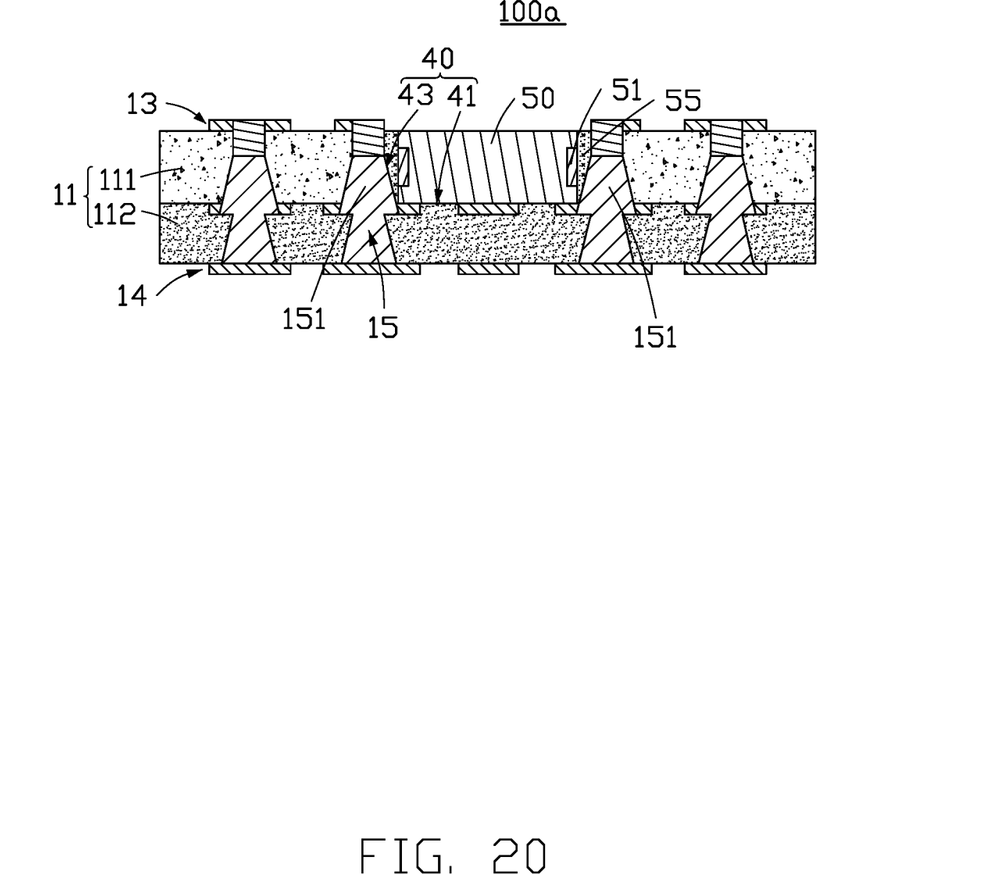
FIG. 20 is a cross-sectional view of another embodiment of a circuit board.

FIG. 20 illustrates an embodiment of a circuit board 100a with at least one embedded electronic component. The circuit board 100 includes a wiring board 10 and at least one electronic component 50. The wiring board 10 includes a dielectric layer 11, a plurality of spaced conductive pillars 15, a first wiring layer 13, and a second wiring layer 14. The first wiring layer 13 and the second wiring layer 14 are stacked along a first direction, and formed on opposite sides of the dielectric layer 11. Each of the plurality of spaced conductive pillars 15 electrically connects the first wiring layer 13 and the second wiring layer 14.

At least one groove 40 is recessed from a side of the dielectric layer 11 facing away from the second wiring layer 14 toward the second wiring layer 14. Each of the at least one groove 40 includes a first recessed portion 41 and at least two spaced second recessed portions 43. Each of the at least two spaced second recessed portions 43 is recessed from a sidewall of the first recessed portion 41 toward a direction away from the first recessed portion 41. At least a part of an end surface of each of the plurality of spaced conductive pillars 15 facing away from the second wiring layer 14 is exposed from the at least two spaced second recessed portions 43, a part of a sidewall of each of the plurality of spaced conductive pillars 15 close to the first recessed portion 41 is exposed from the at least two spaced second recessed portions 43. The at least one electronic component 50 is received in the first recessed portion 41, and is electrically connected to the plurality of spaced conductive pillars 15 through electrical connecting portions 55 received in the at least two spaced second recessed portions 43.

Each of the plurality of spaced conductive pillars 15 includes a first conductive portion 151. A width of a cross section along the first direction of the conductive portion 151 may gradually decrease from an end of the conductive portion 151 facing the wiring layer 14 to an end of the conductive portion 151 facing away from the wiring layer 14. Therefore, it is convenient to form the electrical connecting portions 55.

The dielectric layer 11 includes a first layer 111 and a second layer 112 stacked along the first direction. The first layer 111 may be made of a developing material, such as a developable photoresist or a developing ink.

In at least one embodiment, each of the at least one groove 40 penetrates the first layer 111.

The wiring board 10 may be a double-layer wiring board or a multilayer wiring board. In at least one embodiment, the wiring board 10 is a three-layer wiring board.

In at least one embodiment, each of the at least one groove 40 receives one electronic component 50. In another embodiment, each of the at least one groove 40 receives at least two electronic components 50, and an arrangement of the at least two electronic components 50 may be varied as needed.

In the above method of for manufacturing a circuit board, the electronic component is embedded into an area of the circuit board around the plurality of the conductive pillars and electrically connects the plurality of the conductive pillars. Compared with the prior art, the above method may omit a process of forming conductive areas on sidewalls to connect the electronic component and the wiring layer. The number and distribution of the embedded electronic components may be adjusted according to the circuit design, which is beneficial to improve a flexibility of embedding the electronic components. In addition, the above method of for manufacturing the circuit board is simple in process and easy to produce, and is beneficial to the lightness and thinness of the embedded circuit board.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A circuit board comprising:
a wiring board comprising a dielectric layer, a plurality of spaced conductive pillars, a first wiring layer, and a second wiring layer; and
at least two electronic components, each of the at least one electronic component comprising at least two sidewalls and at least two connecting pads disposed on the at least two sidewalls;
wherein the first wiring layer and the second wiring layer are stacked along a first direction, and formed on opposite sides of the dielectric layer, each of the plurality of spaced conductive pillars electrically connects the first wiring layer and the second wiring layer; a groove is recessed from a side of the dielectric layer facing the second wiring layer toward another side of the dielectric layer facing the second wiring layer, the groove does not entirely passing through the dielectric layer, the groove comprises a hollow first recessed portion and at least two spaced second recessed portions, each of the at least two spaced second recessed portions is recessed from a sidewall of the first recessed portion toward a direction away from the first recessed portion, the at least two electronic components are received in the first recessed portion, each of the at least two spaced second recessed portions is defined between the sidewall of a corresponding one of the at least two electronic components and a sidewall of a corresponding one of the plurality of spaced conductive pillars, at least two electrical connecting portions are disposed in the at least two spaced second recessed portions, the at least two electric connecting portions are made of a conductive material, each of the two electrical connecting portions electrically connect one of the plurality of spaced conductive pillars to a corresponding one of the at least two connecting pads.

2. The circuit board of claim 1, wherein the wiring board further comprises a third wiring layer embedded in the dielectric layer and arranged between the first wiring layer and the second wiring layer; each of the plurality of spaced conductive pillars comprises a first conductive portion, a second conductive portion, and a third conductive portion, an end of the second conductive portion away from the first conductive portion connects to the second wiring layer, an end of the first conductive portion away from the second conductive portion connects to the third wiring layer, an end of the third conductive portion away from the first conductive portion connects to the second wiring layer, a width of a cross section of the first conductive portion gradually decreases along the first direction, a width of a cross section of the second conductive portion is equal along the first direction, a width of a cross section of the third conductive portion gradually decreases along the first direction.

3. The circuit board of claim 1, wherein the dielectric layer comprises a first layer and a second layer stacked along the first direction, the first layer is made of a developing material.

4. The circuit board of claim 3, wherein the groove penetrates the first layer.

5. The circuit board of claim 1, wherein the at least two electronic components are spaced from each other and received in the first recessed portion, each of the at least two electronic components is electrically connected to the plurality of spaced conductive pillars through the electrical connecting portions.

6. The circuit board of claim 1, wherein the circuit board further comprises an outer circuit structure on the wiring board to encapsulate the at least two electronic components in the groove.

7. The circuit board of claim 6, wherein the circuit board further comprises two solder masks formed on opposite sides of the wiring board, and a side of the outer circuit structure facing away from the wiring board is combined with one of the solder masks.

8. The circuit board of claim 1, wherein the conductive material is a conductive glue.

* * * * *